(12) United States Patent
Knödgen

(10) Patent No.: US 6,801,445 B2
(45) Date of Patent: Oct. 5, 2004

(54) MULTIPLE LEVEL RAM DEVICE

(75) Inventor: Horst Knödgen, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 156 days.

(21) Appl. No.: 10/305,051

(22) Filed: Nov. 26, 2002

(65) Prior Publication Data

US 2004/0085813 A1 May 6, 2004

(30) Foreign Application Priority Data

Nov. 4, 2002 (EP) ............................................ 02368121

(51) Int. Cl.[7] ............................................ G11C 27/00
(52) U.S. Cl. ................ 365/45; 365/189.01; 365/189.08; 365/185.03
(58) Field of Search ............................ 365/45, 189.01, 365/189.08, 185.03

(56) References Cited

U.S. PATENT DOCUMENTS

| | | | |
|---|---|---|---|
| 3,705,391 A | 12/1972 | Baker | 340/173 CA |
| 5,459,686 A | 10/1995 | Saito | 365/149 |
| 5,479,170 A | 12/1995 | Cauwenberghs et al. | 341/200 |
| 5,559,734 A | 9/1996 | Saito | 365/168 |
| 5,673,221 A | 9/1997 | Calligaro et al. | 365/168 |
| 5,808,932 A | 9/1998 | Irrinki et al. | 365/150 |
| 5,847,991 A * | 12/1998 | Tong et al. | 365/185.03 |
| 6,069,830 A | 5/2000 | Seo | 365/207 |
| 6,084,797 A | 7/2000 | Maloberti et al. | 365/185.03 |
| 6,094,368 A * | 7/2000 | Ching | 365/49 |

FOREIGN PATENT DOCUMENTS

| | | | |
|---|---|---|---|
| GB | 1486912 | 9/1974 | G11C/7/00 |
| JP | 52004746 | 1/1977 | G11C/11/24 |

* cited by examiner

*Primary Examiner*—Richard Elms
*Assistant Examiner*—Toan Le
(74) *Attorney, Agent, or Firm*—George O. Saile; Stephen B. Ackerman; Douglas R. Schnabel

(57) ABSTRACT

A multiple level logic memory device is achieved. The device comprises, first, a plurality of memory cells capable of storing an analog voltage. Second, there is included a means of converting an external data word value comprising one value of a set of at least three possible values into a writing analog voltage corresponding to the external data word value. Third, a means of decoding an external address value in response to a write command such that the writing analog voltage is electrically coupled to the memory cell is included. Fourth, there is included a means of converting the memory cell analog voltage into an external data word value comprising one value of the set of at least three possible values corresponding to the memory cell analog voltage. Finally, a means of encoding the external address value in response to a read command such that the memory cell analog voltage is electrically coupled to the means of converting the memory cell analog voltage is used.

23 Claims, 4 Drawing Sheets

MULTIPLE LEVEL RAM DEVICE

BACKGROUND OF THE INVENTION (1) Field of the Invention

The invention relates to a multiple level logic, memory device, and more particularly, to a multiple level logic, dynamic RAM device and methods to read and write such a device.

(2) Description of the Prior Art

Memory devices are a critical component in modern electonics systems. Nonvolatile memories, static memories, and dynamic memories are some of the more popular forms. Typical memory systems store data as binary bits of information. Each memory cell is typically configured to store a digital data bit representing a '0' or a '1' value. If, for example, the memory technology is a nonvolatile device, then the storage mechanism is the threshold voltage of the nonvolatile transistor. A '0' value is stored when the threshold voltage is low while a '1' value is stored when the threshold voltage is high. Such digital systems are termed binary because the data bits can take one of only two possible values: '0' or '1'.

Referring now to FIG. 1, a prior art, binary level logic, memory device is shown. In this example, the memory technology is a dynamic RAM, or DRAM. An individual DRAM cell, cell i, 10 is shown. This cell 10 is one of a large array of cells that make up the DRAM device. In the DRAM cell 10, the cell memory state is represented by the charge stored on a cell capacitor $C_{CELL}$ 18. The DRAM cell 10 may be accessed for reading or writing. Typically, memory cells are grouped into bytes (8 bits) or words (16 bits) that are accessible in a single read/write cycle. However, to simplify the schematic, only a single bit, or cell 10, is shown.

To access the cell i 10 for writing, the address of the cell is set on the external address bus $A_0$–$A_n$ 34. The data value $D_x$ 38 of the cell 10 is set on the external data bus. The decoder block 26 of the memory device selects the specific cell i 10 based on the address value $A_0$–$A_n$ 34. The data value $D_x$ 38 is then routed to cell i 10 as the voltage signal $V_i$ 22. In a typical arrangement, the decoder 26 activates a specific word line, not shown, to turn on an access transistor, not shown. The voltage signal $V_i$ 22 is then forced onto a specific bit line to effectively couple $V_i$ 22 to $C_{CELL}$ 14.

The stored data state of cell i 10 is read in a similar fashion. To read cell i 10, the external address value $A_0$–$A_n$ 34 is used by the encoder block 30 to select cell i 10. Once again, a particular word line is asserted to activate an access transistor, not shown. The charge stored on $C_{CELL}$ 14 is then accessible through the sharing voltage $V_{ie}$ 42. A sense amp 46 is used to detect the state, '0' or '1', of cell I 10 and to generate the correct data value $D_x$ 38.

Several observations can now be made concerning the prior art memory device. First, the system is binary. The only allowed values for $D_x$ 38 are '0' and '1'. $D_x$ 38 is translated into a storage voltage $V_i$ 22 comprising one of two possible voltages, 0 Volts and VDD. Second, because the system is binary, every bit of data stored in the memory array requires one cell 10. Therefore, a 2 Megabit memory requires 2 Megabits of cells. Third, if the memory density of the device is to increase, most of the effort must focus on reducing the size of each cell and the size of the routing overhead associated with decoding and encoding. It would advantageous to be able to increase memory density without increasing the number of cells.

Several prior art inventions describe class D amplifiers. U.S. Pat. No. 6,084,797 to Maloberti describes a method to read a multiple logic level, non-volatile memory cell. The approach forces a sequence of currents through a selected cell drain and then measures the voltage to determine the stored value. U.S. Pat. No. 6,069,830 to Seo discloses a circuit and a method to determine the value stored in a multiple level logic, nonvolatile memory device. Drain current is forced into a selected cell and the word line voltage is sequenced until the drain current matches a reference value. U.S. Pat. No. 5,673,221 to Calligaro et al describes a circuit and a method to read a multiple level logic, nonvolatile memory cell. The approach uses a current comparitor to determine the cell threshold.

SUMMARY OF THE INVENTION

A principal object of the present invention is to provide an effective and very manufacturable multiple level logic, memory device.

A further object of the present invention is to provide an effective method to read and write a multiple level logic, memory device.

Another further object of the present invention is to provide a multiple level logic, memory device wherein the memory cell technology is dynamic RAM.

A still further object of the present invention is to provide a multiple level logic, memory device that provides increased data storage per unit area.

In accordance with the objects of this invention, a multiple level logic memory device is achieved. The device comprises, first, a plurality of memory cells capable of storing an analog voltage. Second, there is included a means of converting an external data word value comprising one value of a set of at least three possible values into a writing analog voltage corresponding to the external data word value. Third, a means of decoding an external address value in response to a write command such that the writing analog voltage is electrically coupled to the memory cell is included. Fourth, there is included a means of converting the memory cell analog voltage into an external data word value comprising one value of the set of at least three possible values corresponding to the memory cell analog voltage. Finally, a means of encoding the external address value in response to a read command such that the memory cell analog voltage is electrically coupled to the means of converting the memory cell analog voltage is used.

Also in accordance with the objects of this invention, a method to write data into a multiple level logic memory is achieved. The multiple level memory device comprises a plurality of memory cells capable of storing an analog voltage. The method comprises, first, converting an external data word value comprising one value of a set of at least three possible values into a writing analog voltage corresponding to the external data word value. Last, an external address value is decoded in response to a write command such that the writing analog voltage is electrically coupled to a memory cell.

Also in accordance with the objects of this invention, a method to read data from a multiple level logic memory device is achieved. The multiple level logic memory device comprises a plurality of memory cells capable of storing an analog voltage. The method comprises, first, encoding an external address value in response to a read command such that an analog voltage of the memory cell is electrically coupled to a means of converting the memory cell analog voltage. Last, the memory cell analog voltage is converted into an external data word value comprising one value of a set of at least three possible values corresponding to the memory cell analog voltage.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a novel, multiple level logic, memory circuit and methods to read and write this circuit. The novel circuit and method handle multiple level logic using analog control. Through the teachings of the present invention, memory density can be increased without increasing memory cell count. It should be clear to those experienced in the art that the present invention can be applied and extended without deviating from the scope of the present invention.

Figure 1:
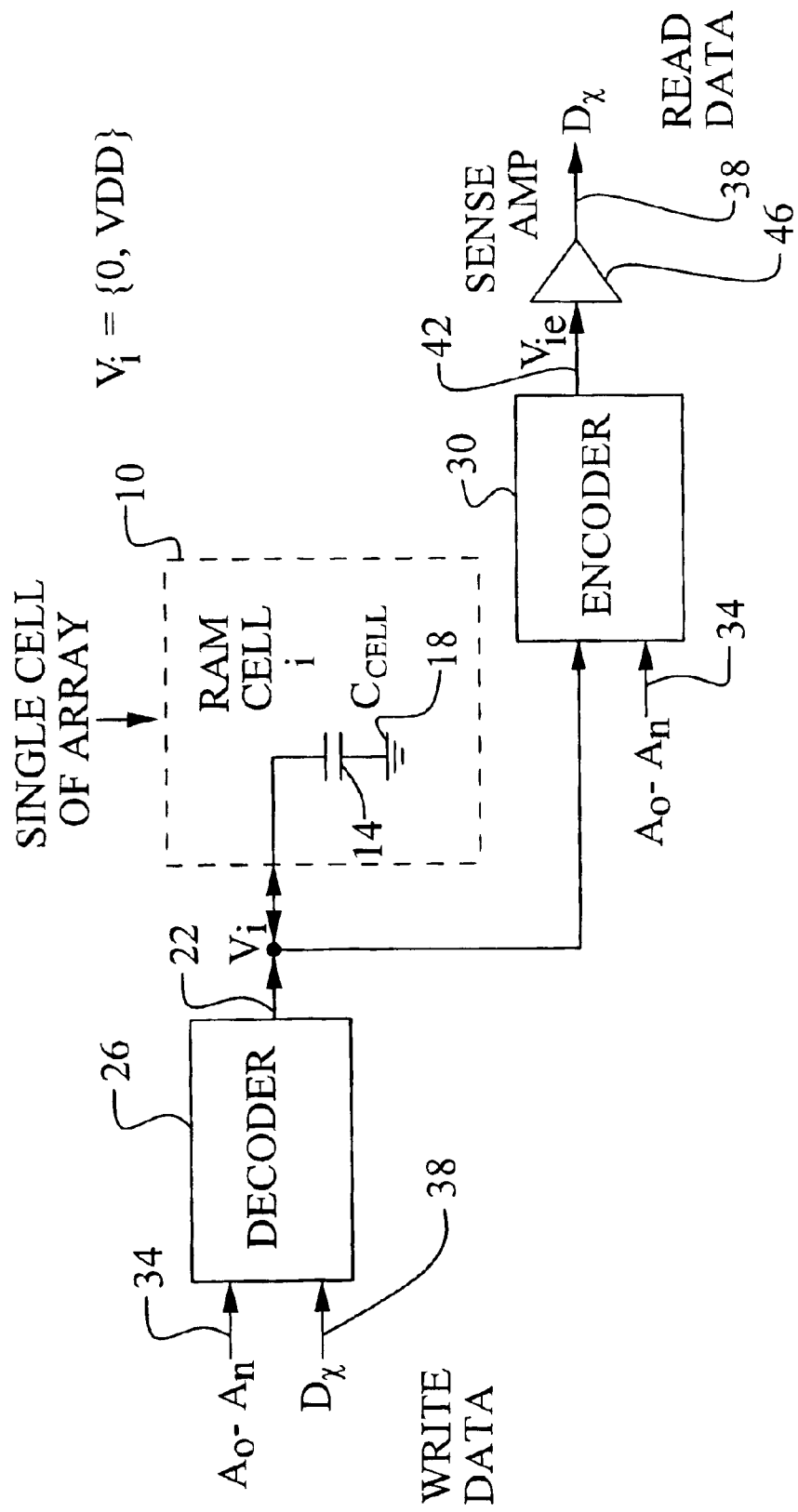
FIG. 1 illustrates a prior art, binary level memory device.
Figure 2:
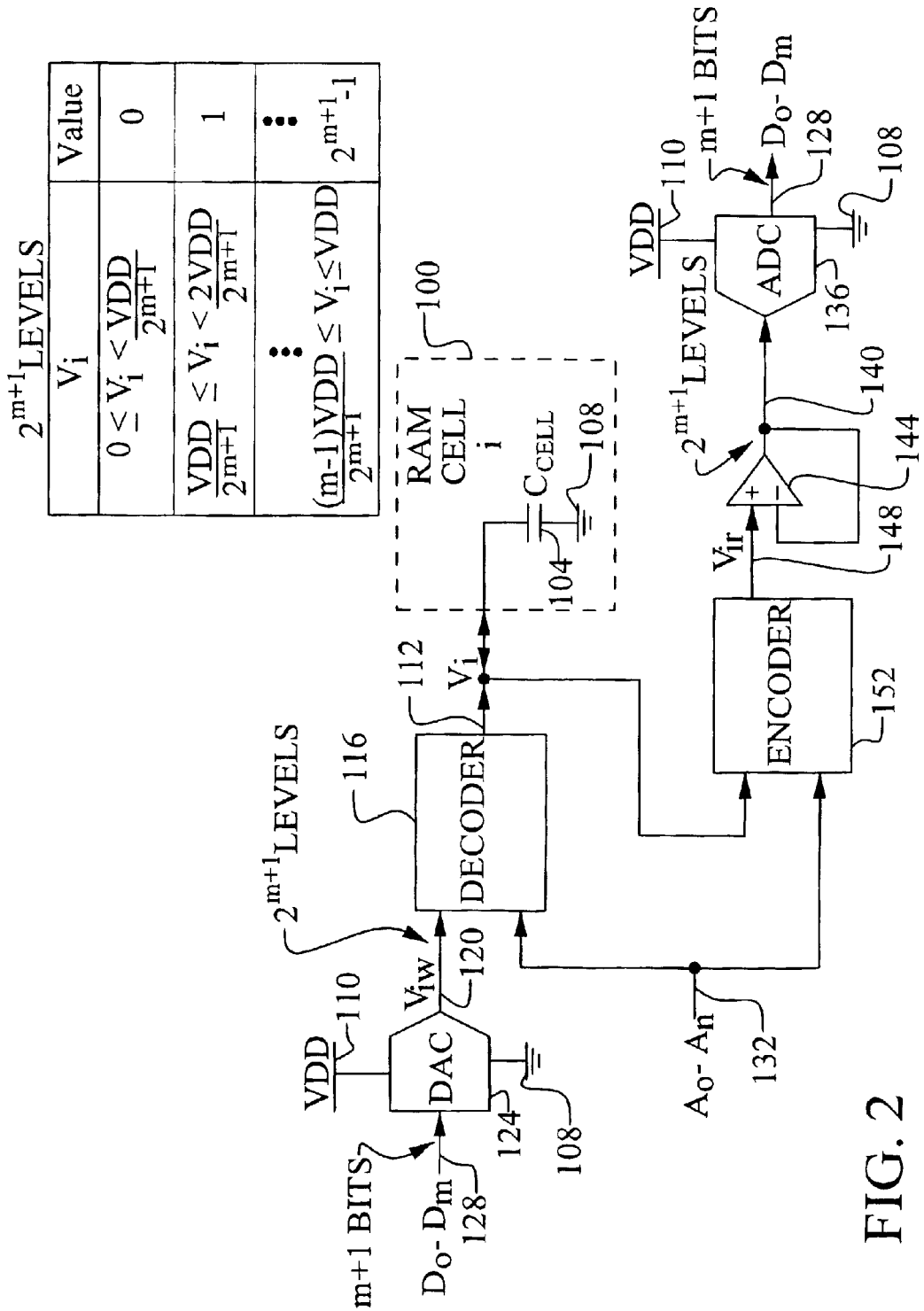
FIG. 2 illustrates a first preferred embodiment of a multiple level logic, memory device of the present invention.

Referring now to FIG. 2, a first preferred embodiment of a multiple level logic, memory device of the present invention is illustrated. Several important features of the present invention are shown.

Figure 3:
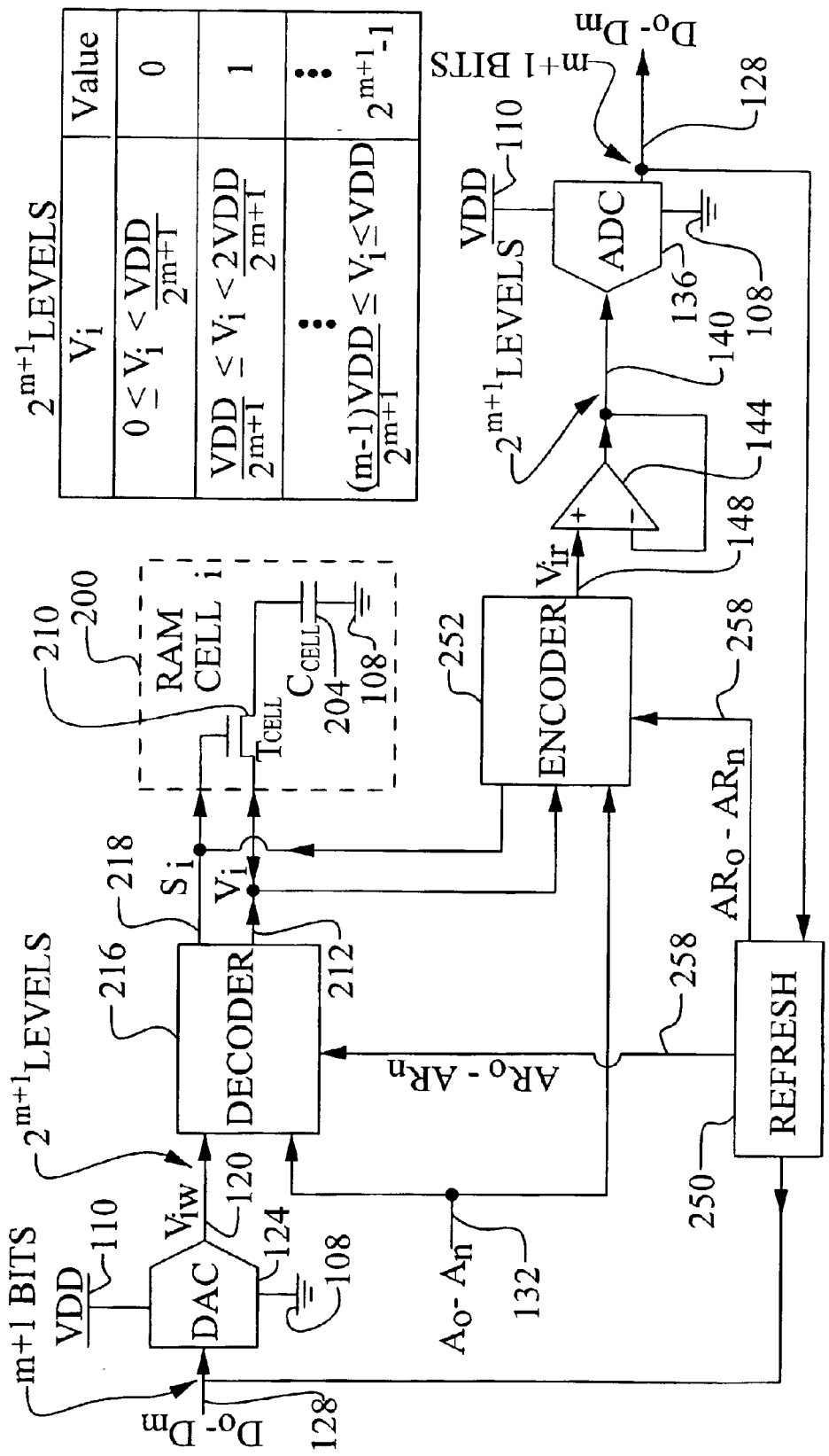
FIG. 3 illustrates a second preferred embodiment of a multiple level logic, memory device of the present invention.

As an important feature, the device comprises, first, a plurality of memory cells 100 capable of storing an analog voltage. In the simplified schematic representation, a single cell, cell i 100, of an array of such cells is shown. The memory cells must comprise a type that can store an analog voltage. More specifically, each cell must be able to retain an analog voltage value $V_i$ 112 for a useful duration. In the preferred case, the cells 100 comprise dynamic RAM cells wherein a capacitor structure $C_{CELL}$ 104 is formed. This capacitor $C_{CELL}$ 104 is capable of storing the analog voltage $V_i$ 112 for a time period. Due to leakage, the charge on the cell capacitor of the dynamic RAM cells may require a periodic refreshing operation. The DRAM cell 100 preferably comprises a capacitor $C_{CELL}$ 104 that may be used alone or may be combined with an access transistor as shown in FIG. 3. Alternative configurations of DRAM cells are well known in the art.

Referring again to FIG. 2, as a very important feature of the present invention, there is included a means 124 of converting an external data word value $D_0-D_m$, comprising one value of a set of at least three possible values, into a writing analog voltage $V_{iw}$ corresponding to the external data word value $D_0-D_m$. More preferably, a digital-to-analog converter (DAC) 124 is used. Note that the data input value $D_0-D_m$ 128 in the present invention comprises a multiple bit value, or word. This means that $D_0-D_m$ 128 comprises at least two bits of data. In the 2-bit case, this means that the external data word equals, for example, $D_0-D_1$. If this 2-bit value is binary encoded, then the possible values for $D_0-D_1$ are 0, 1, 2, and 3. Therefore, $D_0-D_1$ would meet the requirement of having a value from a set of at least three possible values. Alternatively, $D_0-D_m$ 128 could represent a 3-bit word (8 possible values), a 4-bit word (16 possible values) and so on.

The means 124 of converting the external data word value $D_0-D_m$ 128 preferably generates a writing analog voltage $V_{iw}$ 120 that is a fraction of the memory supply VDD 110. This conversion can be performed using a variety of transfer functions. However, an exemplary transfer for a 2-bit data word is shown in Table 1 below. Note that the purpose of the DAC conversion 124 is to map each possible external data word value $D_0-D_m$ 128 to a unique analog voltage $V_{iw}$ 120. A more general mapping criteria is shown in FIG. 2.

TABLE 1

Digital-to-Analog Conversion for 2-Bit Data Word.

| $D_0-D_m$ | $V_{iw}$ |
|---|---|
| 0 | 0 Volts |
| 1 | .33 VDD |
| 2 | .67 VDD |
| 3 | VDD |

As another important feature, a means of decoding 116 an external address value $A_0-A_n$ 132 in response to a write command, such that the writing analog voltage $V_{iw}$ 120 is electrically coupled to the memory cell 100, is included. The decoder 116 uses the external address $A_0-A_n$ 132 to select a particular cell 100 in the memory cell array. As in the prior art example, an individual memory cell 100 may be selected using a word line signal, not shown, that is asserted when the decoder 116 logic detects the address $A_0-A_n$ 132 associated with that word line. The assertion of this word line selects the target cell 100. Further, the write analog voltage $V_{iw}$ 120 is electrically coupled to the memory cell 100 by, for example, routing it on the bit line, not shown, for the cell 100. In this way, the decoder block 116 selects the correct cell i 100 and presents the analog voltage $V_i$ 112 for storage in the cell capacitor $C_{CELL}$ 104. By electrically coupling $V_i$ 112 to $C_{CELL}$ 104, the data value is stored in the cell 100.

A key advantage of the present invention can be seen. Multiple bits of data $D_0-D_m$ 128 are stored on a single memory cell 100. This multiple bit storage is accomplished by storing one of multiple possible levels on the cell 100. Because of the DAC process 124, the storage capability of each cell 100 is multiplied. In the case of a 2-bit conversion, the storage capacity is increased from 2 possible values (0 and 1) to 4 possible values (0, 1, 2, and 3). This is a 100% increase in storage capacity.

As another important feature of the present invention, there is included a means of converting 136 a memory cell analog voltage $V_{ir}$ 148 into an external data word value $D_0-D_m$ 128 comprising one value of the set of at least three possible values corresponding to the memory cell analog voltage $V_i$ 112. Finally, there is included a means of encoding 152 the external address value $A_0-A_n$ 132 in response to a read command such that the memory cell analog voltage $V_i$ 112 is electrically coupled to the means of converting 144 the memory cell analog voltage $V_i$ 112. The means of converting 136 preferably comprises an analog-to-digital converter (ADC) 136. The encoder block 152 and the ADC block 136 work much that same for reading a cell 100 as the decoder 116 and DAC 124 do for writing. The encoder block 152 uses the external address value $A_0-A_n$ 132 to select a particular cell 100 for reading. The cell 100 is then electrically coupled to the ADC block 136. Note that a buffer circuit 144, shown as an amplifier configured as a voltage follower, is used to buffer the reading analog voltage $V_{ir}$ 148. In practice the cell capacitor $C_{CELL}$ 104 is a relatively small value and, therefore, has a finite charge to share with any parasitic capacitance in the reading path. The buffer 144 may be needed to provide a lower impedance version 140 of the stored voltage $V_{ir}$ 148 to the ADC 136.

The ADC 136 block is referenced to the memory supply voltage VDD 110. By converting the cell analog voltage $V_{ir}$ 148 to an external data value $D_0$–$D_m$ 128, the multiple bit data is restored for external usage. Note that whereas the DAC block 124 converts discrete digital values to discrete analog values, the ADC block 136 must convert analog value ranges to discrete digital values. An exemplary conversion for a 2-bit memory cell is shown in Table 2 below with a general form shown in FIG. 2.

TABLE 2

Analog-to-Digital Conversion for 2-Bit Data Word.

| $V_{ir}$ | $D_0$–$D_m$ 128 |
|---|---|
| $V_{ir}$ < VDD/6 | 0 |
| VDD/6 [ $V_{ir}$ < VDD/2 | 1 |
| VDD/2 [ $V_{ir}$ < 5 VDD/6 | 2 |
| $V_{ir}$ µ 5 VDD/6 | 3 |

Referring now to FIG. 3, a second preferred embodiment of a multiple level logic, memory device of the present invention is illustrated. The second embodiment is the same as the first embodiment but includes two alternative features. First, as discussed above, the RAM memory cell i 200 is formed from a combination of a cell capacitor $C_{CELL}$ 204 and an access transistor $T_{CELL}$ 210. In this embodiment, the decoder 216 and the encoder 252 select a cell i 200 by asserting the selection signal $S_i$ 218 for that particular cell i 200.

The second feature is the inclusion of the refresh controller 250. As discussed above, the dynamic RAM cell 200 of the present invention requires a periodic refresh to maintain the storage state of the cell capacitor $C_{CELL}$ 204. The refresh controller 250 uses idle time, when the memory device is not actively reading or writing, to perform the refresh function. The refresh controller 250 periodically selects each cell 100 for reading using the refresh address lines $AR_0$–$AR_n$ 258. The cell voltage $V_{ir}$ 148 is converted to a data word $D_0$–$D_m$ 128 by the ADC block 136. This data word $D_0$–$D_m$ 128 is then used by the DAC block 124 to re-write the same analog voltage $V_{iw}$ 120 back into the cell i 200. The refresh function thereby maintains the stored data value in each cell.

It is found that the device of the present invention is capable of increasing the memory density. The resulting multiple level logic, memory device occupies about ⅓ of the chip area of a same-sized binary memory device.

Figure 4:
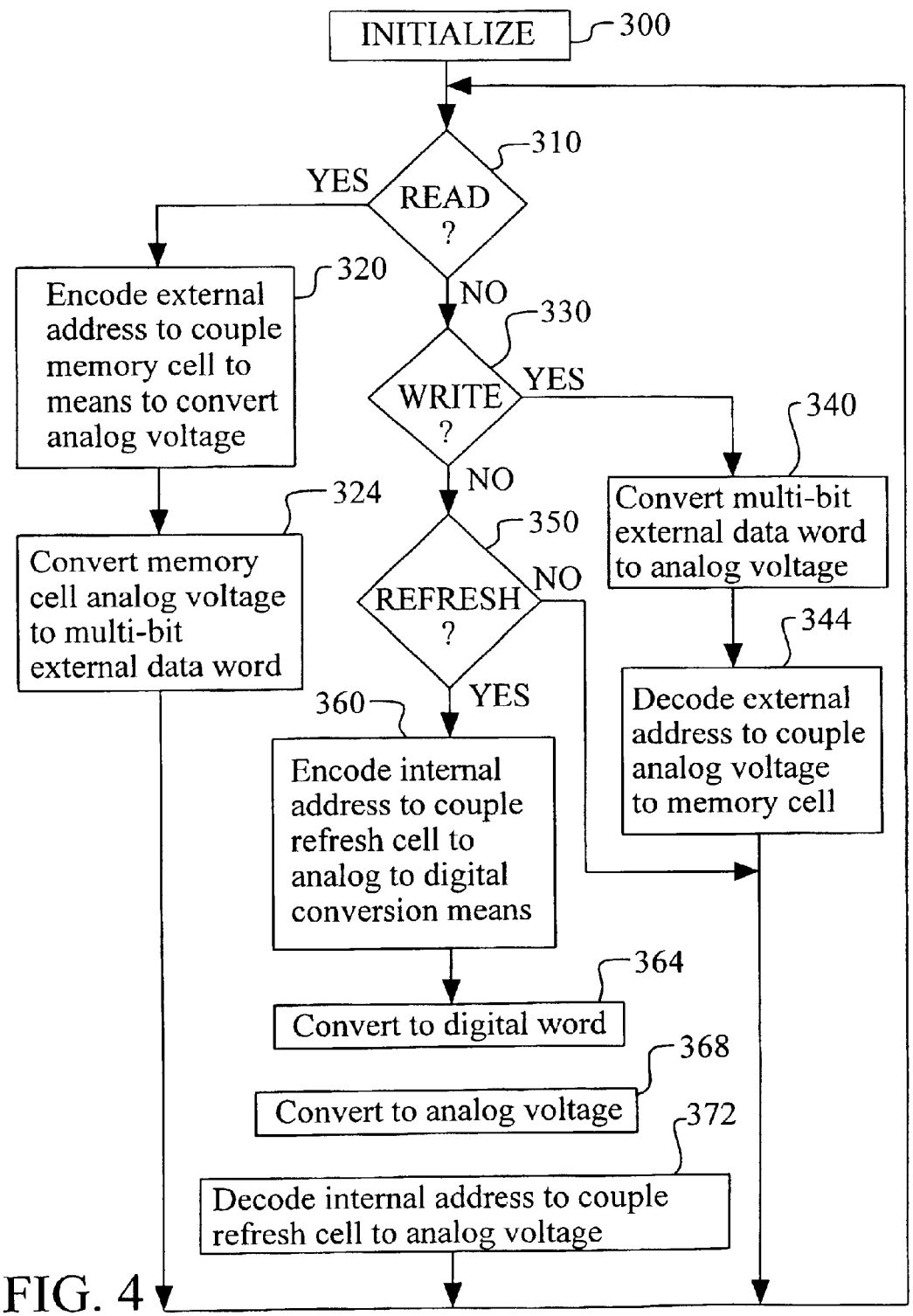
FIG. 4 illustrates a preferred embodiment of a method of reading, writing, and refreshing a multiple level logic, memory device of the present invention.

Referring now to FIG. 4, a preferred embodiment of a method of reading, writing, and refreshing a multiple level logic, memory device of the present invention is illustrated. Several important features of the present invention are shown. The method begins with an initialization in step 300. The current status of the memory device is determined in steps 310, 330, and 350.

If a read of the memory device is requested, then the method further comprises encoding an external address value in response to a read command such that the analog voltage of the memory cell is electrically coupled to a means of converting the memory cell analog voltage in step 320. The memory cell analog voltage is then converted into an external data word value comprising one value of a set of at least three possible values corresponding to the memory cell analog voltage in step 324.

If a write is requested, then the method further comprises converting an external data word value comprising one value of a set of at least three possible values into a writing analog voltage corresponding to the external data word value in step 340. An external address value is then decoded in response to a write command such that the writing analog voltage is electrically coupled to a memory cell in step 344.

If a refresh is indicated, such as when the device is in a non-read and non-write state, then the method further comprises, encoding an internal address value such that the analog voltage of the refresh memory cell is electrically coupled to a means of converting the memory cell analog voltage in step 360. The memory cell analog voltage is then converted into a data word value comprising one value of a set of at least three possible values corresponding to the memory cell analog voltage in step 364. Next, the data word value is converted into a writing analog voltage corresponding to the data word value in step 368. Finally, the internal address value is decoded such that the writing analog voltage is electrically coupled to the refresh memory cell in step 372.

The advantages of the present invention may now be summarized. An effective and very manufacturable multiple level logic, memory device is achieved. Further, an effective method to read and write a multiple level logic, memory device is provided. The multiple level logic, memory device is compatible with dynamic RAM technology. Finally, the multiple level logic, memory device provides increased data storage per unit area.

As shown in the preferred embodiments, the novel circuit and method provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A multiple level logic memory device comprising:
    a plurality of memory cells capable of storing an analog voltage;
    a means of converting an external data word value comprising one value of a set of at least three possible values into a writing analog voltage corresponding to said external data word value;
    a means of decoding an external address value in response to a write command such that said writing analog voltage is electrically coupled to said memory cell;
    a means of converting said memory cell analog voltage into an external data word value comprising one value of said set of at least three possible values corresponding to said memory cell analog voltage; and
    a means of encoding said external address value in response to a read command such that said memory cell analog voltage is electrically coupled to said means of converting said memory cell analog voltage.

2. The circuit according to claim 1 wherein said memory cells comprise dynamic RAM.

3. The circuit according to claim 2 wherein said memory cells each comprise a capacitor.

4. The circuit according to claim 2 wherein said memory cells each comprise a selection transistor and a capacitor.

5. The circuit according to claim 1 wherein said means of converting an external data word value into a writing analog voltage comprises a digital-to-analog converter.

6. The circuit according to claim 1 wherein said means of converting said memory cell analog voltage into an external data word value comprises an analog-to-digital converter.

7. The circuit according to claim 1 further comprising a buffer circuit coupled between said memory cell and said means of converting said memory cell analog voltage into an external data word value.

8. The circuit according to claim 1 further comprising a means of refreshing said memory cell analog voltage.

9. A multiple level logic DRAM device comprising:
a plurality of DRAM cells capable of storing an analog voltage;
a digital-to-analog converter for converting an external data word value comprising one value of a set of at least three possible values into a writing analog voltage corresponding to said external data word value;
a means of decoding an external address value in response to a write command such that said writing analog voltage is electrically coupled to said DRAM cell;
an analog-to-digital converter for converting said DRAM cell analog voltage into an external data word value comprising one value of said set of at least three possible values corresponding to said DRAM cell analog voltage;
a means of encoding said external address value in response to a read command such that said DRAM cell analog voltage is electrically coupled to said analog-to-digital converter; and
a buffer circuit coupled between said DRAM cell and said analog-to-digital converter.

10. The circuit according to claim 9 wherein said DRAM memory cells each comprise a capacitor.

11. The circuit according to claim 9 wherein said DRAM cells each comprise a selection transistor and a capacitor.

12. The circuit according to claim 9 further comprising a means of refreshing said DRAM cell analog voltage.

13. A method to write data into a multiple level logic memory device comprising a plurality of memory cells capable of storing an analog voltage, said method comprising:
converting an external data word value comprising one value of a set of at least three possible values into a writing analog voltage corresponding to said external data word value; and
decoding an external address value in response to a write command such that said writing analog voltage is electrically coupled to a memory cell.

14. The method according to claim 13 wherein said memory cells comprise dynamic RAM.

15. The method according to claim 14 wherein said memory cells each comprise a capacitor.

16. The method according to claim 14 wherein said memory cells each comprise a selection transistor and a capacitor.

17. The method according to claim 13 wherein said step of converting an external data word value is performed by a digital-to-analog converter.

18. A method to read data from a multiple level logic memory device comprising a plurality of memory cells capable of storing an analog voltage, said method comprising:
encoding an external address value in response to a read command such that an analog voltage of said memory cell is electrically coupled to a means of converting said memory cell analog voltage; and
converting said memory cell analog voltage into an external data word value comprising one value of a set of at least three possible values corresponding to said memory cell analog voltage.

19. The method according to claim 18 wherein said memory cells comprise dynamic RAM.

20. The method according to claim 19 wherein said memory cells each comprise a capacitor.

21. The method according to claim 19 wherein said memory cells each comprise a selection transistor and a capacitor.

22. The method according to claim 18 wherein said step of converting said memory cell analog voltage is performed using an analog-to-digital converter.

23. The method according to claim 18 further comprising buffering said memory cell analog voltage prior to said step of converting said memory cell analog voltage.

* * * * *